United States Patent
Inoue

(10) Patent No.: US 7,508,263 B2
(45) Date of Patent: Mar. 24, 2009

(54) DIGITAL AMPLIFYING APPARATUS WITH NOISE REDUCTION

(75) Inventor: Takao Inoue, Kawagoe (JP)

(73) Assignee: Pioneer Corporation, Tokyo (JP)

(*) Notice: Subject to any disclaimer, the term of this patent is extended or adjusted under 35 U.S.C. 154(b) by 87 days.

(21) Appl. No.: 11/666,610

(22) PCT Filed: Nov. 1, 2005

(86) PCT No.: PCT/JP2005/020084

§ 371 (c)(1),
(2), (4) Date: Apr. 30, 2007

(87) PCT Pub. No.: WO2006/049154

PCT Pub. Date: May 11, 2006

(65) Prior Publication Data

US 2008/0129381 A1    Jun. 5, 2008

(30) Foreign Application Priority Data

Nov. 2, 2004    (JP)    .............................. 2004-319841

(51) Int. Cl.
*H03F 3/217*    (2006.01)
*H03F 3/191*    (2006.01)

(52) U.S. Cl. .................................. 330/207 A; 330/306

(58) Field of Classification Search ............. 330/207 A, 330/251, 306
See application file for complete search history.

(56) References Cited

U.S. PATENT DOCUMENTS 6,653,897 B2 * 11/2003 Sawashi ....................... 330/10
7,279,964 B2 * 10/2007 Bolz et al. .................... 330/10
2003/0020539 A1    1/2003 Sawashi ....................... 330/10
2008/0192960 A1 *  8/2008 Nussbaum et al. .......... 381/120

FOREIGN PATENT DOCUMENTS

JP    63-135008    6/1988
JP    10-32439    2/1998
JP    2003-46345    2/2003

OTHER PUBLICATIONS

Japanese Official Action and English translation thereof of corresponding Japanese Application No. 2006-542392.

* cited by examiner

*Primary Examiner*—Steven J Mottola
(74) *Attorney, Agent, or Firm*—Young & Thompson

(57) ABSTRACT

A digital amplifying apparatus includes a positive-phase amplifier, an inverting amplifier, a pair of LPFs, a positive and a negative noise component extracting unit, and noise component coupling units that couple a negative and a positive noise component extracted by the negative and the positive noise component extracting units with a positive and a negative PWM signals.

5 Claims, 11 Drawing Sheets

DIGITAL AMPLIFYING APPARATUS WITH NOISE REDUCTION

TECHNICAL FIELD

The present invention relates to a digital amplifying apparatus. Use of the present invention is not limited to the above digital amplifying apparatus.

BACKGROUND ART

In a digital amplifying apparatus, a digital amplifier including a positive-phase amplifier and an inverting amplifier. An output terminal is connected to a speaker through a so-called Balanced Transformerless connection (hereinafter, "BTL connection"). Waveforms having inverse phases to each other are output from the positive-phase amplifier and the inverting amplifier, respectively, due to class-D operations at each amplifier. Such a digital amplifying apparatus can facilitate an improvement of output voltage over that of an apparatus equipped with an ordinary amplifier.

FIG. 1 is a schematic block diagram of a schematic configuration of a digital amplifying apparatus including a digital amplifier executing a class-D operation (hereinafter, "class-D amplifier"). As shown in FIG. 1, the digital amplifying apparatus is configured by a class-D amplifying unit 101 and an amplifier output processing unit 102 that processes output from the class-D amplifying unit 101. The class-D amplifying unit 101 includes a positive-phase amplifier 101a and an inverting amplifier 101b. The amplifier output processing unit 102 includes low-pass filters (hereinafter, "LPF") 102a and 102b, low-pass filter 102a connected to output terminals of the positive-phase amplifier 101a, and low-pass filter 102b connected to output terminals of the inverting amplifier 101b.

The digital amplifying apparatus having the above configuration is configured by connecting the output terminals of the positive-phase amplifier 101a and the inverting amplifier 101b to a speaker 103 through the LPFs 102a and 102b and, thereby, the positive-phase amplifier 101a and the inverting amplifier 101b function for the speaker 103 as one BTL-connected amplifier.

In a digital amplifying apparatus, an input digital audio signal is converted by PWM (Pulse Width Modulation) into a pair of PWM signals, each having a phase inverse of the other. Of the PWM signals, a positive PWM signal is provided to the positive-phase amplifier 101a and a negative PWM signal is provided to the inverting amplifier 101b.

The positive-phase amplifier 101a and the inverting amplifier 101b realize a class-D operation. This operation causes the positive and the negative PWM signals to switch predetermined DC voltage, and the PWM signals are thus power-amplified. The power-amplified positive and negative PWM signals are converted into analog-waveform audio signals through the LPFs 102a and 102b, and the audio signals are provided to the speaker 103.

In the class-D operation of the above digital amplifying apparatus, a noise (hereinafter, "switching noise") is generated during the switching by the positive and the negative PWM signals. The switching noise includes a noise component that can not be removed by the LPFs 102a and 102b.

For example, when a switching frequency and the high frequency wave thereof, in the positive-phase amplifier 101a and the inverting amplifier 101b, are radio frequencies (or a frequency in the vicinity), a noise is generated in a reproduced signal, such as with radio reception of an audio signal. In this case, setting the cutoff frequency of the LPFs 102a and 102b at a lower frequency has a limit. Therefore, the noise component in the radio frequency band included in the switching noise is difficult to remove by the LPFs 102a and 102b. Hence, in this case, the remaining noise component that is not removed by the LPFs 102a and 102b interferes with the reception of broadcasts in the radio frequency band, and adversely affects the radio reception.

A method of removing such a remaining noise component can be, for example, a method of disposing a filter component between the LPFs 102a and 102b and the speaker 103 to remove the remaining noise component (see, for example, Patent Document 1).

Patent Document 1: Japanese Patent Application Laid-Open Publication No. 2003-046345

DISCLOSURE OF INVENTION

Problem to be Solved by the Invention

Though various ideas have been considered for the removal of the remaining noise component, sufficient removal thereof is difficult to realize. Therefore, realization of effective removal of the noise component is desired. Especially, for a BTL-connected digital amplifying apparatus, because an in-phase noise component and an out-phase noise component are included, a method of effectively removing these noise components is demanded. Realization of the noise removal at a low cost, and with a simple configuration, is also desired.

Means for Solving Problem

To at least solve the above problems in the conventional technologies and achieve an object of the present invention, a digital amplifying apparatus having a pair of amplifiers that respectively power-amplify in a switching scheme an input positive signal and an input negative signal that have phases inverse to each other, and a pair of low-pass filters that are respectively input with the positive signal and the negative signal output from the pair of amplifiers, the pair of low-pass filters respectively outputting the positive and the negative signals to a BTL-connected speaker, comprises noise component extracting units that respectively extract a positive noise component and a negative noise component included respectively in the positive and the negative signals output from the pair of low pass filters; and a noise component coupling unit that couples the the positive noise component extracted by the noise component extracting unit with a negative noise component included in the negative signal output from one of the low pass filters, and couples the negative noise component extracted by the noise component extracting unit with a positive noise component included in the positive signal output from the other of the low pass filters.

Figure 1:
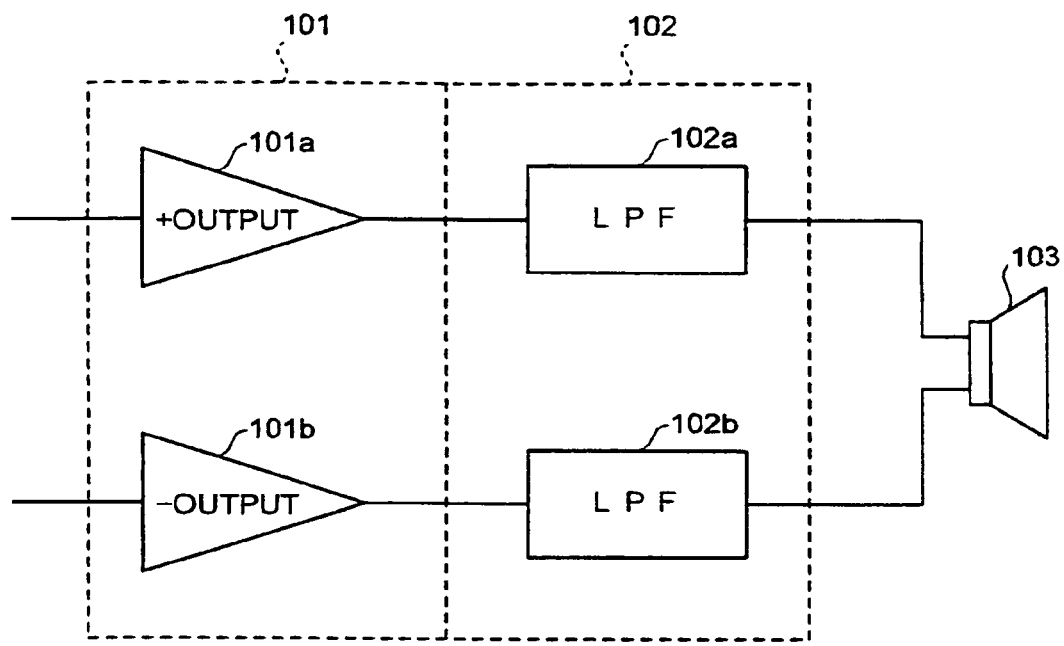
FIG. 1 is a schematic block diagram of a configuration of a conventional digital amplifying apparatus.

EXPLANATIONS OF LETTERS OR NUMERALS 201 class-D amplifying unit
202 amplifier output unit
203a positive-phase amplifier
203b inverting amplifier
204a, 204b LPF
205a positive noise component extracting unit
205b negative noise component extracting unit
208a, 208b noise component coupling unit
209 speaker
600 in-phase component removing unit
800 in-phase component removing circuit

BEST MODE(S) FOR CARRYING OUT THE INVENTION

In order to solve the problems of the above conventional technique, an object of the present invention is to provide a digital amplifying apparatus that can effectively remove the noise component remaining in the latter stage of the LPF. With reference to the accompanying drawings, exemplary embodiments of a digital amplifying apparatus according to the present invention are described in detail below.

First Embodiment

Figure 2:
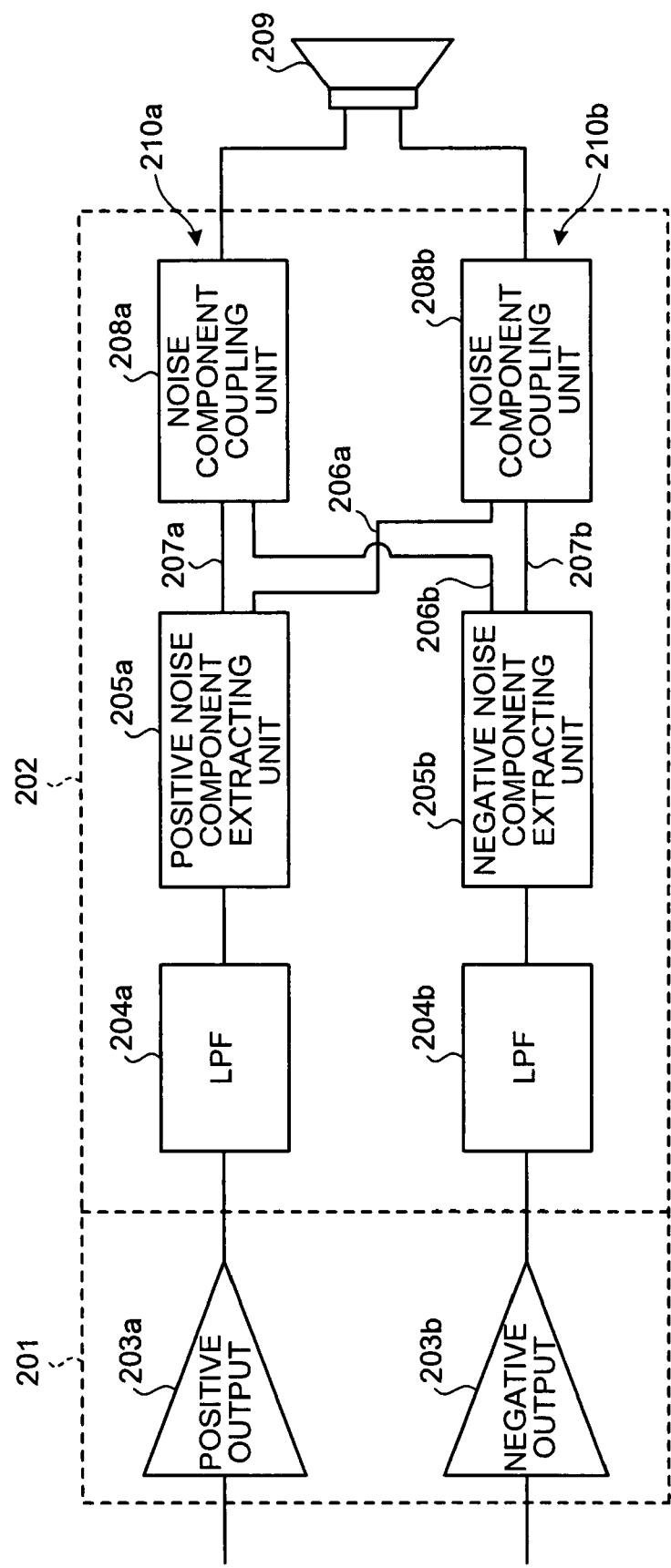
FIG. 2 is a schematic block diagram of a configuration of a digital amplifying apparatus according to a first embodiment of the present invention.
Figure 3:
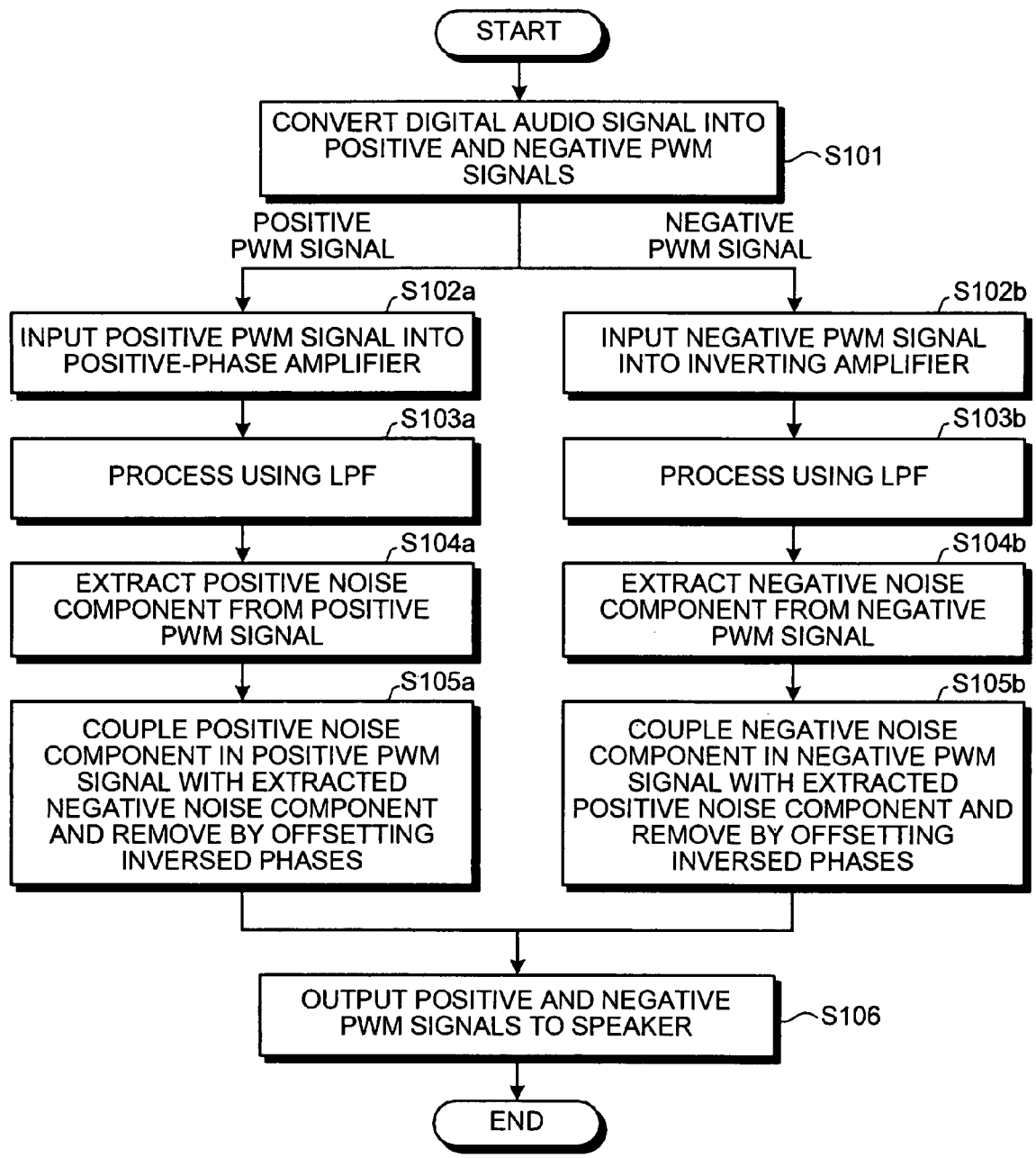
FIG. 3 is a flowchart illustrating an overview of the operation of the digital amplifying apparatus shown in FIG. 2.

FIG. 2 is a schematic block diagram of the configuration of a digital amplifying apparatus according to a first embodiment of the present invention. FIG. 3 is a flowchart of an overview of the operation of the digital amplifying apparatus shown in FIG. 2. As shown in FIG. 2, the digital amplifying apparatus of the embodiment includes a class-D amplifying unit 201 and an amplifier output processing unit 202 that processes output from the class-D amplifying unit 201. The digital amplifying apparatus is connected to a speaker 209 that is a sound output unit.

The class-D amplifying unit 201 includes a positive-phase amplifier 203a and an inverting amplifier 203b. The amplifier output processing unit 202 includes LPFs 204a and 204b respectively connected to output terminals of the positive-phase amplifier 203a and the inverting amplifier 203b, and a positive and a negative noise component extracting units 205a and 205b, and noise component coupling units 208a and 208b respectively connected to output terminals of the LPFs 204a and 204b.

In this case, the positive-phase amplifier 203a, the LPF 204a, and the noise component coupling unit 208a form an output path 210a of a positive PWM signal, and the inverting amplifier 203b, the LPF 204b, and the noise component coupling unit 208b form an output path 210b of a negative PWM signal. The above components 203a to 205a and 208a, and 203b to 205b and 208b, respective of each of the output paths 210a and 210b respectively of the positive and the negative PWM signals, are connected in this order by wiring.

In this case, the positive noise component extracting unit 205a is configured to be able to output an extracted positive noise component 206a hereinafter described to the noise component coupling unit 208b, and the negative noise component extracting unit 205b is configured to be able to output an extracted negative noise component 206b hereinafter described to the noise component coupling unit 208a. Output terminals of the noise component coupling units 208a and 208b are connected respectively to ends of the speaker 209 and, thereby, a configuration by the positive-phase amplifier 203a and the inverting amplifier 203b that function for the speaker 209 as one BTL-connected amplifier is realized.

As shown in FIG. 3, in the digital amplifying apparatus shown in FIG. 2, an input digital signal is first converted by the PWM modulation into a pair of positive and negative PWM signals respectively having phases being the inverse of each other (step S101). The positive PWM signal is input into the positive-phase amplifier 203a shown in FIG. 2 (step S102a) and the negative PWM signal is input into the inverting amplifier 203b shown in FIG. 2 (step S102b). In this manner, a so-called class-D operation is realized in each of the positive-phase amplifier 203a and the inverting amplifier 203b shown in FIG. 2 respectively input with the positive and the negative PWM signals. Hence, the positive and the negative PWM signals are power-amplified by switching a predetermined DC voltage.

Of the positive and the negative PWM signals power-amplified as above, the positive PWM signal is provided to the LPF 204a shown in FIG. 2 and the negative PWM signal is provided to the LPF 204b shown in FIG. 2. The positive and the negative PWM signals are converted respectively by the LPFs 204a and 204b into analog waveform audio signals, and frequency components corresponding to cutoff frequencies respective to the LPFs 204a and 204b are removed respectively therefrom (steps S103a and S103b).

As described for the conventional technique, in the positive-phase amplifier 203a and the inverting amplifier 203b shown in FIG. 2, switching noises are generated in the switching by the positive and the negative PWM signals during the class-D operations. These switching noises each include a positive noise component and a negative noise component and these components are distributed widely over frequency bands.

Of the positive and the negative noise components of the switching noises, a majority of the frequency components corresponding to the respective cutoff frequencies of the LPFs 204a and 204b shown in FIG. 2 are removed by the LPFs 204a and 204b (see FIG. 2). On the other hand, remaining components that have not been removed by the LPFs 204a and 204b (see FIG. 2), for example, the positive and negative noise components in the radio frequency band of the switching noises are output respectively through the LPFs 204a and 204b (see FIG. 2) being superimposed respectively on the positive and the negative PWM signals.

Therefore, in the embodiment, the positive and the negative noise component extracting units 205a and 205b, and the noise component coupling units 208a and 208b respectively remove the remaining positive and negative noise components. The positive and the negative PWM signals, on which the positive and the negative noise components are superimposed, are respectively output to the positive and the negative noise component extracting units 205a and 205b. The positive noise component extracting unit 205a extracts the positive noise component 206a (see FIG. 2) from the positive PWM signal (step S104a) and the negative noise component extracting unit 205b extracts the negative noise component 206b (see FIG. 2) from the negative PWM signal (step S104b).

The positive and the negative noise components 206a and 206b (see FIG. 2) extracted as above are respectively provided to the noise component coupling unit 208b and the noise component coupling unit 208a.

At this time, in addition to the above negative noise component 206b (see FIG. 2), a positive PWM signal 207a (see FIG. 2) that has passed through the positive noise component extracting unit 205a is provided to the noise component coupling unit 208a. On the other hand, in addition to the above positive noise component 206a (see FIG. 2), a negative PWM signal 207b (see FIG. 2) that has passed through the negative noise component extracting unit 205b is provided to the noise component coupling unit 208b. At this time, the positive and the negative PWM signals 207a and 207b respectively provided to the noise component coupling units 208a and 208b as described above respectively include a positive and a negative noise component that have not been extracted respectively by the positive and the negative noise component extracting units 205a and 205b.

The noise component coupling unit 208a couples (that is, superimposes) the negative noise component 206b with the provided positive PWM signal 207a (see FIG. 2). Due to this coupling of the positive noise components included in the positive PWM signal 207a (see FIG. 2), a component having an output waveform that is the same as and has a phase inverse of the superimposed negative noise component 206b(see FIG. 2) is offset by the negative noise component 206b(see FIG. 2). Therefore, removal of the positive noise component is facilitated by the offsetting for the positive PWM signal 207a(see FIG. 2) (step S105a).

Similarly to the above, the noise component coupling unit 208b couples the positive noise component 206a (see FIG. 2) with the provided negative PWM signal 207b (see FIG. 2). Of the negative noise components included in the negative PWM signal 207b (see FIG. 2), a component having an output waveform that is the same as and a phase that is the inverse of the superimposed positive noise component 206a (see FIG. 2) is offset by the positive noise component 206a (see FIG. 2). Thereby, removal of the negative noise component is facilitated by the offsetting for the negative PWM signal 207b (see FIG. 2) (step S105b).

Through the above extraction of the positive and the negative noise components 206a and 206b by the positive and the negative noise component extracting units 205a and 205b, and the above coupling by the noise component coupling units 208a and 208b, reduction of the positive and the negative noise components is facilitated for the positive and the negative PWM signals 207a and 207b, and these signals 207a and 207b are respectively output to the speaker 209 through the output paths 210a and 210b (step S106).

As described above, according to the digital amplifying apparatus of the embodiment, the positive and the negative noise components of the switching noises, generated by the switching in the class-D operations of the positive-phase amplifier 203a and the inverting amplifier 203b, are removed using the positive and the negative noise component extracting units 205a and 205b, and the noise component coupling units 208a and 208b. Therefore, the positive and the negative PWM signals 207a and 207b for which reduction of the positive and the negative noise components is facilitated can be output to the speaker 209.

First Example

Figure 4:
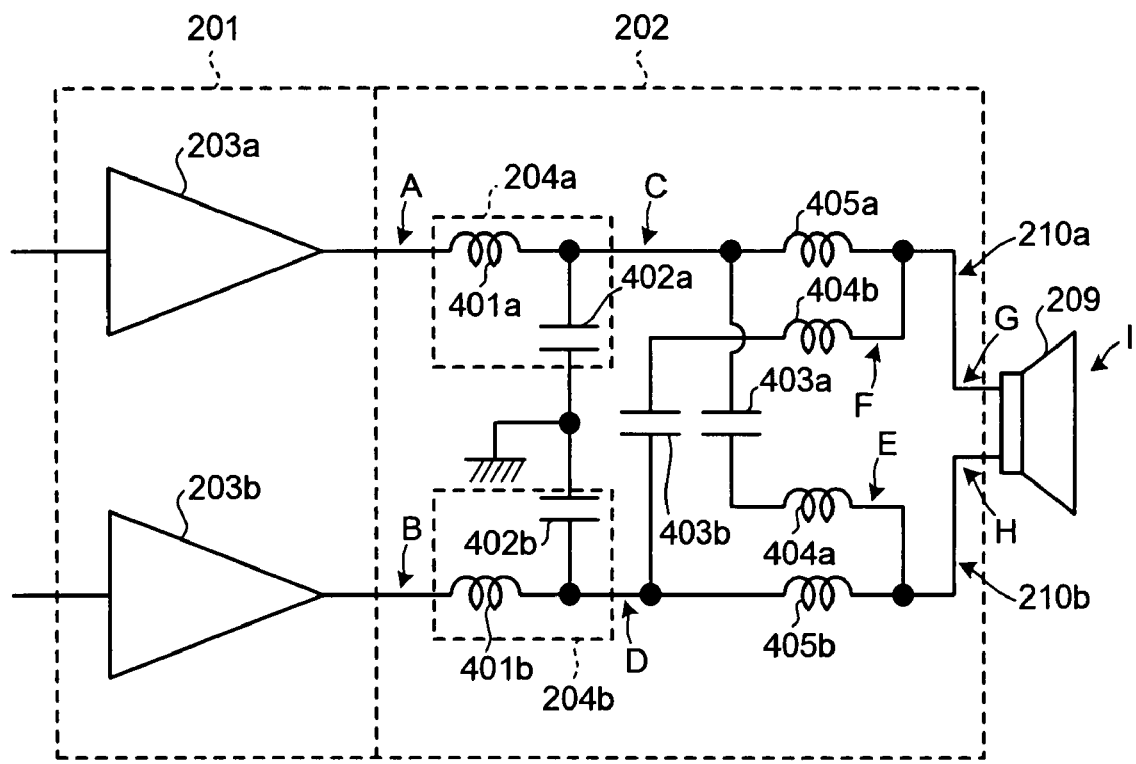
FIG. 4 is a schematic block diagram of a configuration of a digital amplifying apparatus according to a first example of an embodiment of the present invention.

FIG. 4 is a schematic block diagram of a configuration of a digital amplifying apparatus according to a first example of the present invention. In FIG. 4, the same components as those shown in FIG. 2 are given the same reference numerals and description therefor is omitted.

As shown in FIG. 4, in the digital amplifying apparatus of the example: the class-D amplifying unit 201 includes the positive-phase amplifier 203a and the inverting amplifier 203b; in the amplifier output processing unit 202, the LPF 204a includes an inductor 401a and a capacitor 402a connected sequentially to the output terminal of the positive-phase amplifier 203a; and the LPF 204b includes an inductor 401b and a capacitor 402b connected sequentially to the output terminal of the inverting amplifier 203b.

A capacitor 403a and an inductor 404a that correspond to the positive noise component extracting unit 205a of FIG. 2 are sequentially connected to the latter stage of the LPF 204a while a capacitor 403b and an inductor 404b that correspond to the negative noise component extracting unit 205b shown in FIG. 2 are sequentially connected to the latter stage of the LPF 204b.

An end of the inductor 404a corresponding to a noise component output terminal of the positive noise component extracting unit 205a of FIG. 2 is connected to the output path 210b of the negative PWM signal that is a corresponding signal output path. In this case, a configuration configured by connecting the noise component output terminal of the inductor 404a to the output path 210b of the negative PWM signal corresponds to the noise component coupling unit 208b shown in FIG. 2. On the output path 210b of the negative PWM signal, an inductor 405b is further disposed between a connecting point of the path 210b and an output terminal of the inductor 404a, and the capacitor 403b and the inductor 404b that correspond to the above negative noise component extracting unit 205b.

On the other hand, an end of the inductor 404b corresponding to a noise component output terminal of the negative noise component extracting unit 205b shown in FIG. 2 is connected to the output path 210a of the positive PWM signal that is a corresponding signal output path. In this case, a configuration adapted to connect the noise component output terminal of the inductor 404b to the output path 210a of the positive PWM signal corresponds to the noise component coupling unit 208a shown in FIG. 2. On the output path 210a of the positive PWM signal, an inductor 405a is further disposed between a connecting point of the path 210a and an output terminal of the inductor 404b, and the capacitor 403a and the inductor 404a that correspond to the above positive noise component extracting unit 205a.

In the digital amplifying apparatus, connections through wiring realize the connections of the above components 401a to 405a and 401b to 405b and, thereby, the output paths 210a and 210b respectively of the positive and the negative PWM signals are respectively formed. In this case, coils are used as the inductors 401a, 404a, 405a, 401b, 404b, and 405b. By disposing the inductors 401a, 404a, 405a, 401b, 404b, and 405b and the capacitors 402a, 403a, 402b, and 403b respectively in pairs connected in series, the filter configurations are realized.

The output path 210a of the positive PWM signal is connected to the speaker 209 in a latter stage beyond a connecting point of the path 210a and an output terminal of the inductor 404b. The output path 210b of the negative PWM signal is connected to the speaker 209 in a latter stage beyond a connecting point of the path 210b and an output terminal of the inductor 404a. Thereby, the BTL connection is realized in the digital amplifying apparatus of the example.

Figure 5:
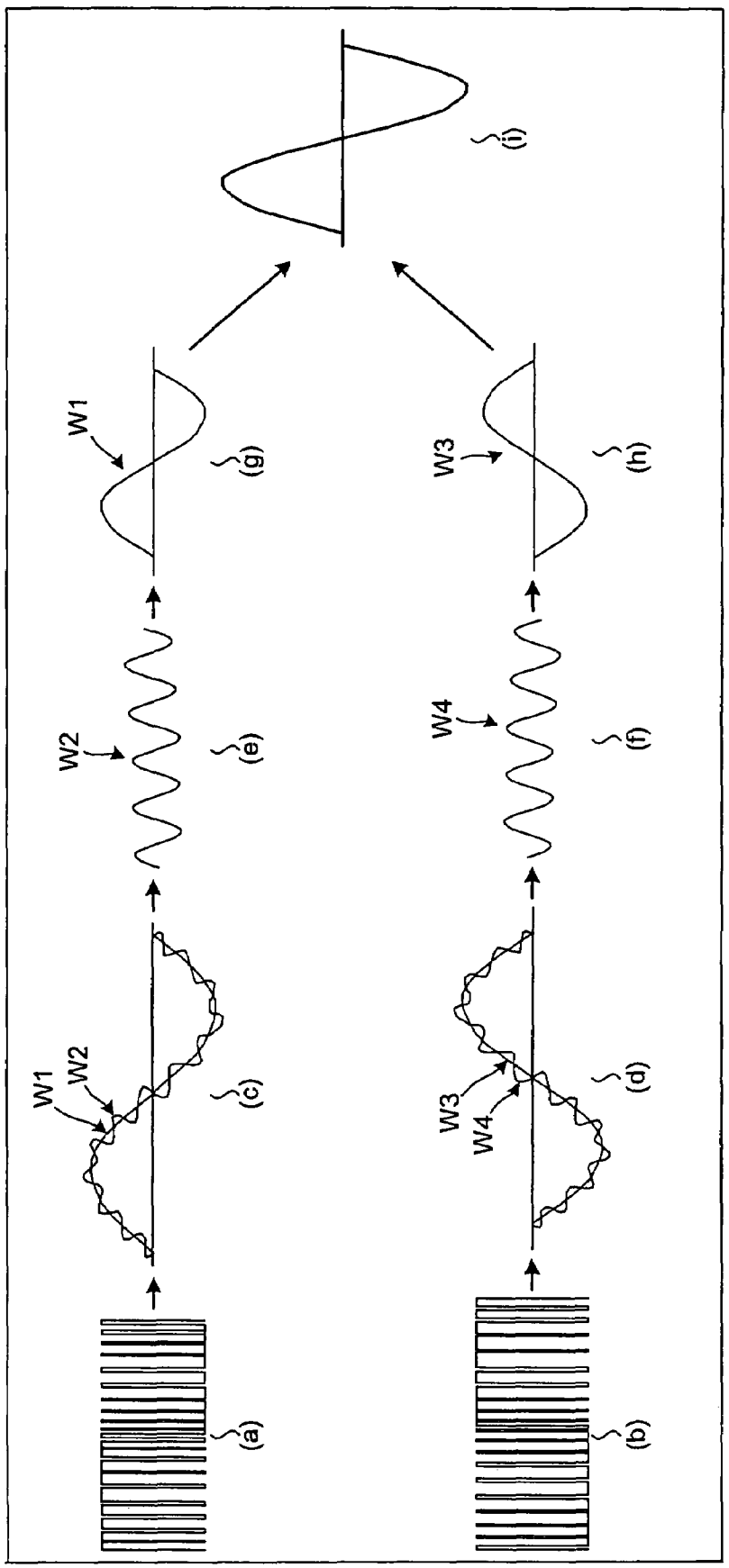
FIG. 5 is a schematic view of signals and noise waveforms of each of the units of the digital amplifying apparatus shown in FIG. 4.

Description will be given for operations in the digital amplifying apparatus of the example that has the above configuration, referring to FIG. 5. FIG. 5 is a schematic view of signals and noise waveforms in each of the components indicated by arrows A to I of the digital amplifying apparatus shown in FIG. 4. More specifically: FIG. 5(a) shows a signal waveform in a part indicated by an arrow A shown in FIG. 4; FIG. 5(b) shows a signal waveform in a part indicated by an arrow B shown in FIG. 4; FIG. 5(c) shows a signal waveform in a part indicated by an arrow C shown in FIG. 4; FIG. 5(d) shows a signal waveform in a part indicated by an arrow D shown in FIG. 4; FIG. 5(e) shows a noise waveform in a part indicated by an arrow E shown in FIG. 4; FIG. 5(f) shows a noise waveform in a part indicated by an arrow F shown in FIG. 4; FIG. 5(g) shows a signal waveform in a part indicated by an arrow G of FIG. 4; FIG. 5(h) shows a signal waveform in a part indicated by an arrow H shown in FIG. 4; and FIG. 5(i) shows a signal waveform in a part indicated by an arrow I shown in FIG. 4.

As shown in FIGS. 5(a) and (b), in the parts indicated by the arrows A and B shown in FIG. 4, digital positive and negative PWM signals are respectively obtained that have been power-amplified by the class-D operations respectively of the positive-phase amplifier 203a and the inverting amplifier 203b. As shown in FIGS. 5(c) and (d), in the parts indicated by the arrows C and D shown in FIG. 4, a positive and a negative PWM signals W1 and W3 are respectively obtained that have respectively been formed by converting the digital positive and negative PWM signals shown in FIGS. 5(a) and (b) into analog signals respectively by the LPFs 204a and 204b shown in FIG. 4.

From the positive and the negative PWM signals W1 and W3 that have passed through the LPFs 204a and 204b obtained as described above, a portion of each of the positive and the negative noise components generated by the switching in the positive-phase amplifier 203a and the inverting amplifier 203b shown in FIG. 4 can not be removed completely by the LPFs 204a and 204b. Therefore, a positive and a negative noise component W2 and W4 still remain.

In the example, as shown in FIGS. 5(e) and (f), the positive and the negative noise component extracting units 205a and 205b (see FIG. 2) configured by capacitors 403a and 403b and the inductors 404a and 404b shown in FIG. 4 extract the remaining positive and the negative noise components W2 and W4 shown in FIGS. 5(c) and (d). The positive noise component W2 shown in FIG. 5(e) that has been extracted is output to the output path 210b of the negative PWM signal shown in FIG. 4 and the negative noise component W4 shown in FIG. 5(f) that has been extracted is output to the output path 210a of the positive PWM signal shown in FIG. 4.

The digital amplifying apparatus of the example combines the positive PWM signal W1 superimposed with the positive noise component W2 as shown in FIG. 5(c) with the negative noise component W4 of FIG. 5(f) extracted on the corresponding signal path. Thereby, the positive noise component W2 superimposed on the positive PWM signal W1 shown in FIG. 5(c) is coupled with the negative noise component W4 that has been combined shown in FIG. 5(f).

Due to the above coupling, of the positive noise component W2 superimposed on the positive PWM signal W1 shown in FIG. 5(c), a component, having the same or approximately the same output waveform and a phase that is inverse to that of the negative noise component W4 that has been combined shown in FIG. 5(f), is offset and removed by the negative noise component W4. Thereby, as shown in FIG. 5(g), reduction of the positive noise component is facilitated for the positive PWM signal W1 output from the output path 210a of the positive PWM signal to the speaker 209.

The digital amplifying apparatus of the example combines the negative PWM signal W3 superimposed with the negative noise component W4 as shown in FIG. 5(d) with the positive noise component W2 shown in FIG. 5(e) extracted on the corresponding signal path. Thereby, the negative noise component W4 superimposed on the negative PWM signal W3 shown in FIG. 5(d) is coupled with the positive noise component W2 that has been combined shown in FIG. 5(e).

Due to the above coupling, of the negative noise component W4 superimposed on the negative PWM signal W3 shown in FIG. 5(d), a component, having the same or approximately the same output waveform as that of and a phase that is inverse to that of the positive noise component W2 that has been combined shown in FIG. 5(e), is offset and removed by the positive noise component W2. Thereby, as shown in FIG. 5(h), reduction of the negative noise component is facilitated for the negative PWM signal W3 output from the output path 210b of the negative PWM signal to the speaker 209.

Reduction of the positive and negative noise components W2 and W4 is facilitated as described above for the positive and the negative PWM signals W1 and W3 (see FIGS. 5(g) and (h)) having phases inverse to each other, and improvement of output voltages is facilitated as shown in FIG. 5(i) at the speaker 209 to which the signals W1 and W3 are output. Therefore, the digital amplifying apparatus of the example can realize a power-amplifying apparatus that has a high output and for which reduction of switching noises is facilitated.

Reduction of the positive and the negative noise components W2 and W4 respectively included in the positive and the negative PWM signals W1 and W3 to be output to the speaker 209 can be facilitated by a configuration that is simple and does not change drastically the configuration of a conventional BTL-connected digital amplifying apparatus, adapted to respectively output the positive and the negative noise components W2 and W4 extracted respectively on the output paths 210a and 210b of the positive and the negative PWM signals, respectively to the corresponding signal output paths, that is, the output paths 210b and 210a of the negative and the positive PWM signals. Therefore the power-amplifying apparatus as described above can be realized at a low cost and with a simple configuration.

Because the positive and the negative noise components W2 and W4 are removed by offsetting each other, a removing unit does not need to be disposed for every noise component inverse phase and, for any frequency band of the switching noise, the noise component in the corresponding frequency band can be removed.

Second Embodiment

Figure 6:
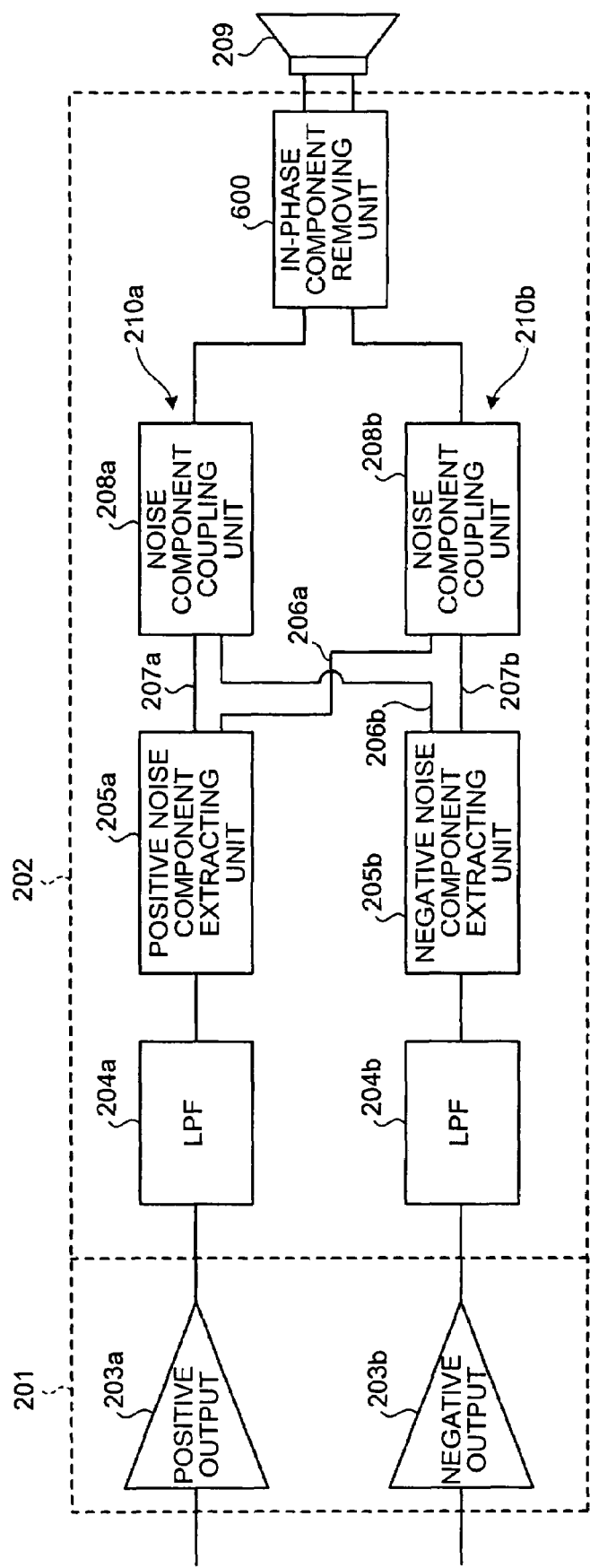
FIG. 6 is a schematic block diagram of a configuration of a digital amplifying apparatus according to a second embodiment of the present invention.
Figure 7:
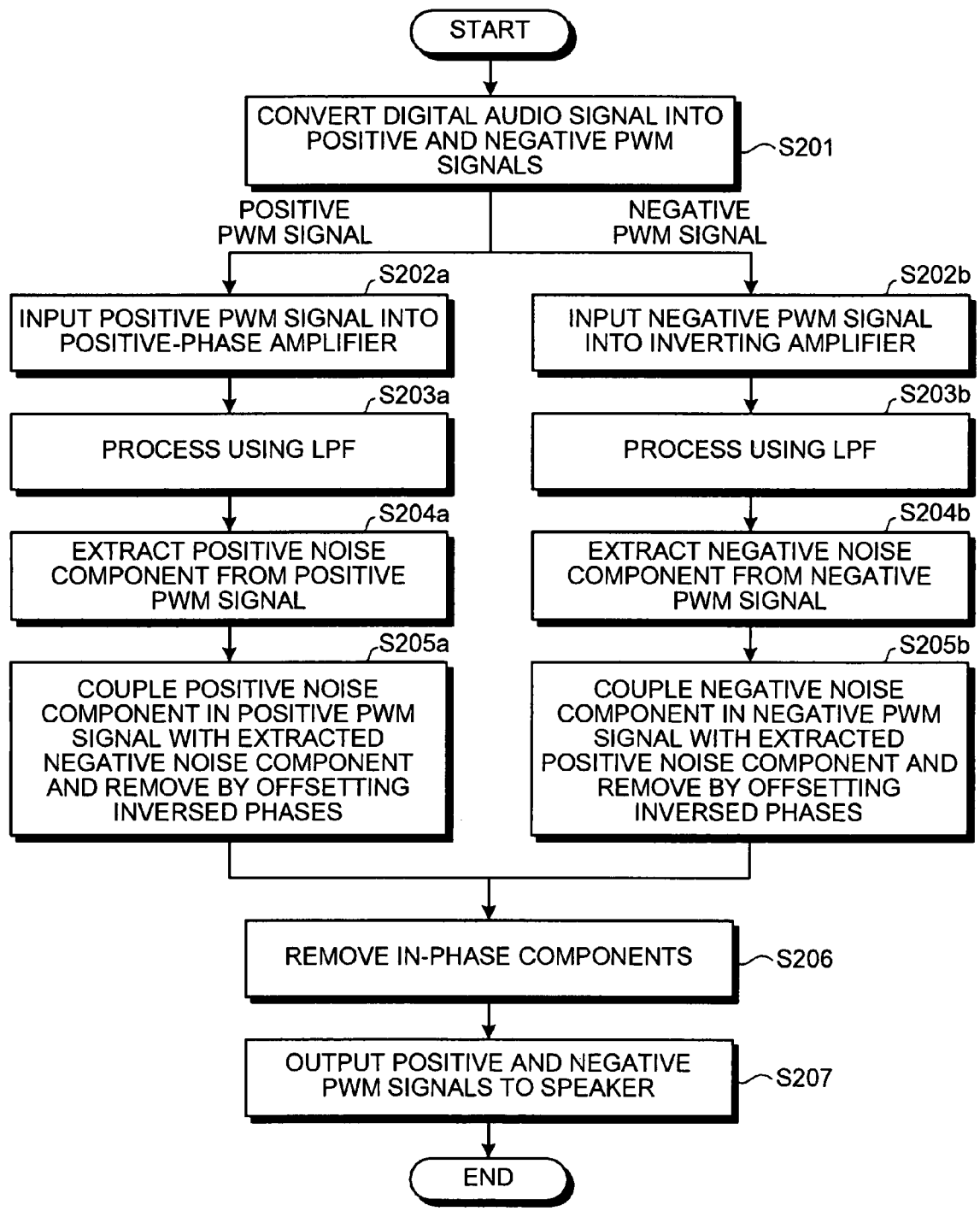
FIG. 7 is a flowchart illustrating an overview of the operation of the digital amplifying apparatus shown in FIG. 6.

FIG. 6 is a schematic block diagram of a configuration of a digital amplifying apparatus according to a second embodiment of the present invention. FIG. 7 is a flowchart of an overview of the operation of the digital amplifying apparatus shown in FIG. 6. In FIG. 6, the same components as those shown in FIG. 2 are given the same reference numerals and description therefor is omitted.

As shown in FIG. 6, the digital amplifying apparatus of the embodiment has a configuration that is the same as that of the digital amplifying apparatus of the first embodiment shown in FIG. 2. However, the configuration according to the embodiment is different from that of the first embodiment in that an in-phase component removing unit 600 is further disposed in the latter stage of the noise component coupling units 208a and 208b. The digital amplifying apparatus with the in-phase component removing unit 600 further disposed therein as described above executes the same operations as those of the first embodiment shown in FIG. 3, however, is different from the first embodiment in the following points.

That is, as shown in FIG. 7, in the digital amplifying apparatus in the embodiment, the same operations as the operations at steps S101, S102a to S105a, and S102b to S105b in the first embodiment shown in FIG. 3 are executed by the components 203a to 208a and 203a to 208a of FIG. 6 at steps S201, S202a to S205a and S202b to S205b.

In the embodiment, the in-phase component removing unit 600 shown in FIG. 6 further removes remaining positive and negative noise components that are not removed by the above noise component coupling in the noise coupling units 208a and 208b, that is, positive and negative noise components having output waveforms different from each other and positive and negative noise components that are not in phase to offset each other (step S206). Thereby, the positive and the negative PWM signals for which reduction of the positive and the negative noise components is further facilitated can be output to the speaker 209 (step S207).

Description is given below for the details of step S206 that is a characteristic configuration of the embodiment. At steps S205a and 205b, the noise components respectively having a same or approximately the same output waveform and a phase that is inverse to that of each other are offset and removed by to the above coupling of the positive and the negative noise components at steps S105a and 105b according to the first embodiment, however, positive and negative noise components having output waveforms different from each other and positive and negative noise components that are not in phase to offset each other are not offset and, therefore, can not be removed.

In this case, the positive and the negative noise components that are not removed at steps S205a and 205b as described above, have the same phase and the same waveform or an approximately same waveform due to the noise component coupling by the noise component coupling units 208a and 208b. According to the embodiment, at step S205, the in-phase component removing unit 600 shown in FIG. 6 removes the positive and the negative noise components respectively included in the positive and the negative PWM signals having the same phase. Thereby, the positive and the negative noise components that can not be removed by the coupling of the noise components by the noise component coupling units 208a and 208b can be removed and, therefore, reduction of the positive and the negative noise components in the positive and the negative PWM signals can be further facilitated.

As described above, in the digital amplifying apparatus according to the embodiment, the noise component coupling units 208a and 208b can remove the positive and the negative noise components similarly to the first embodiment and the in-phase component removing unit 600 can remove the positive and the negative noise components having the same phase as each other that can not be removed by the noise component coupling units 208a and 208b. Therefore, reduction of the noise components can be further facilitated.

Second Example

Figure 8:
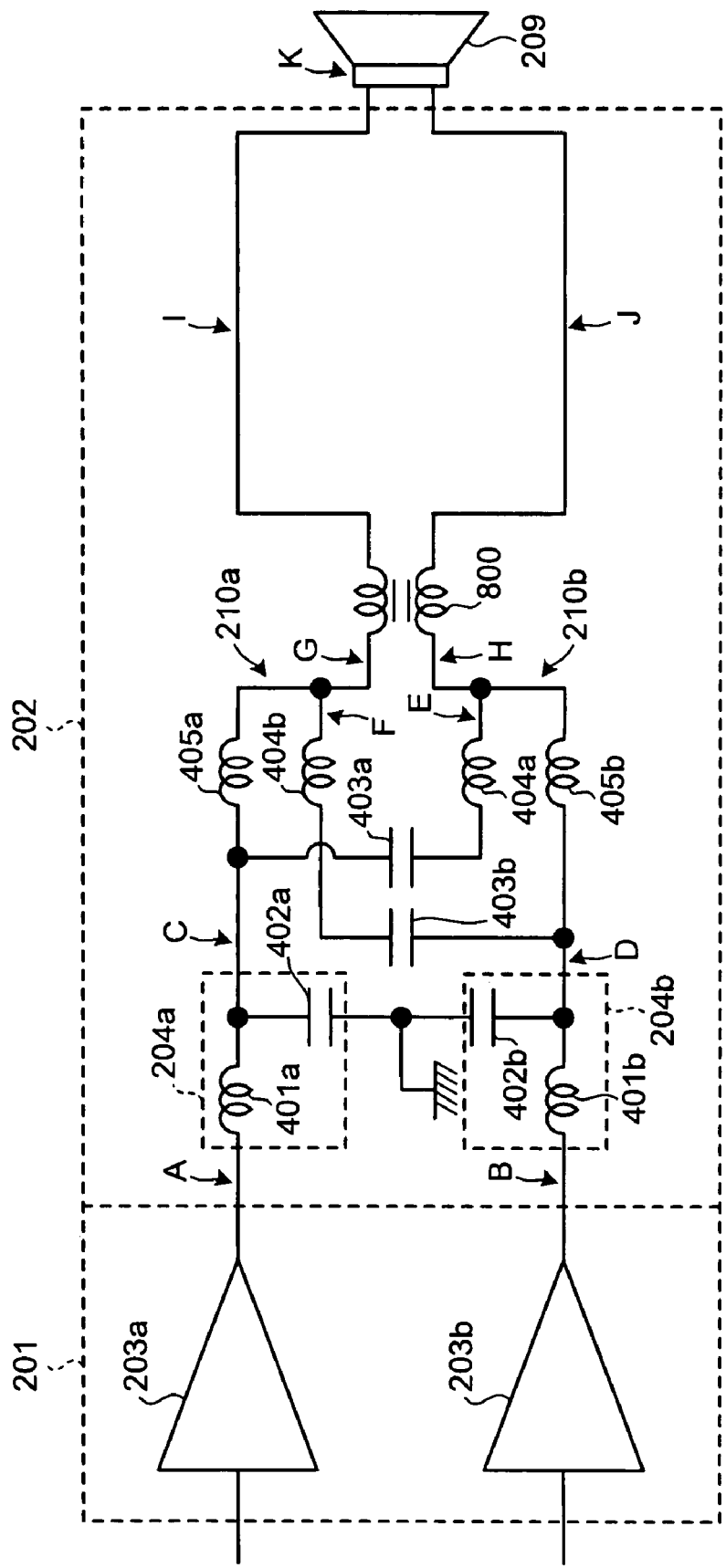
FIG. 8 is a schematic block diagram of a configuration of a digital amplifying apparatus according to a second example of an embodiment of the present invention.

FIG. 8 is a schematic block diagram of a configuration of a digital amplifying apparatus according to a second example of the present invention. In FIG. 8, the same components as those shown in FIG. 4 are given the same reference numerals and description therefor is omitted.

As shown in FIG. 8, though the digital amplifying apparatus of the example has a configuration that is the same as that of the digital amplifying apparatus according to the first example shown in FIG. 4, the apparatus of the example differs from the first example in that, respectively on the output paths 210a and 210b of the positive and the negative PWM signals in the apparatus, an in-phase component removing circuit 800 corresponding to the in-phase component removing unit 600 shown in FIG. 6 is further disposed in the latter stage of the connecting points respective of the output terminals respectively of the inductors 404b and 404a, that respectively configure the noise component coupling units 208a and 208b shown in FIG. 6, and the output paths 210a and 210b of the positive and the negative PWM signals.

In the above configuration, a common-mode choke coil configures the in-phase component removing circuit 800. In the digital amplifying apparatus of the example, that includes the in-phase component removing circuit 800, operations the same as those of the first example are executed. However, the apparatus of the second example differs from that of the first example in that the in-phase component removing circuit 800 further removes the positive and the negative noise components.

Figure 9:
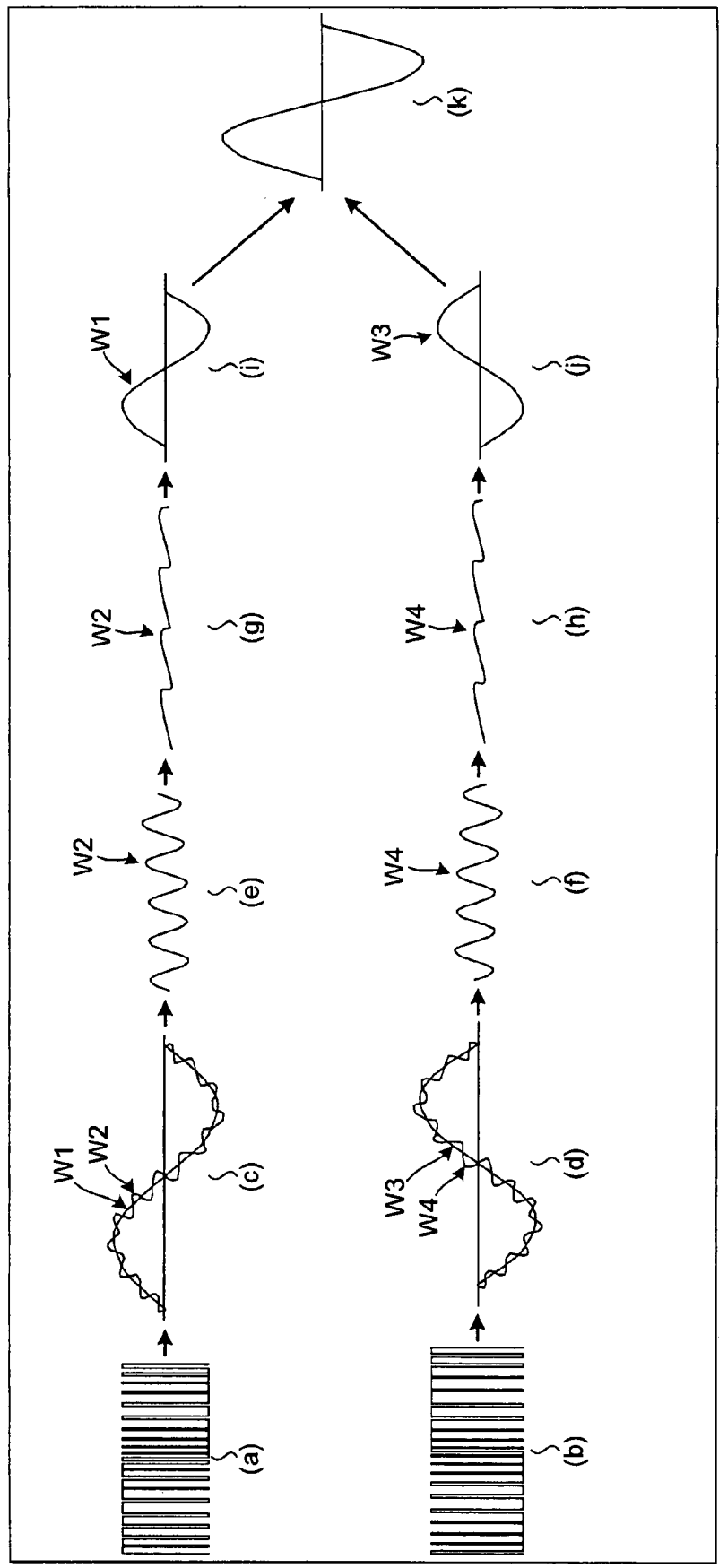
FIG. 9 is a schematic view of signals and noise waveforms of each of the units of the digital amplifying apparatus shown in FIG. 4.

Description is given below for operations of the digital amplifying apparatus of the example, referring to FIG. 9. FIG. 9 is a schematic view of a signal and a noise waveform at parts indicated by arrows A to K of the digital amplifying apparatus shown in FIG. 8. More specifically, FIG. 9(a) shows the signal waveform at the part indicated by the arrow A shown in FIG. 8. FIG. 9(b) shows the signal waveform at the part indicated by the arrow B shown in FIG. 8. FIG. 9(c) shows the signal waveform at the part indicated by the arrow C shown in FIG. 8. FIG. 9(d) shows the signal waveform at the part indicated by the arrow D shown in FIG. 8. FIG. 9(e) shows the signal waveform at the part indicated by the arrow E shown in FIG. 8. FIG. 9(f) shows the signal waveform at the part indicated by the arrow F shown in FIG. 8. FIG. 9(g) shows the signal waveform at the part indicated by the arrow G shown in FIG. 8. FIG. 9(h) shows the signal waveform at the part indicated by the arrow H shown in FIG. 8. FIG. 9(i) shows the signal waveform at the part indicated by the arrow I shown in FIG. 8. FIG. 9(j) shows the signal waveform at the part indicated by the arrow J shown in FIG. 8. FIG. 9(k) shows the signal waveform at the part indicated by the arrow K shown in FIG. 8.

In the digital amplifying apparatus shown in FIG. 8, similarly to the first example, the class-D operations respective of the positive-phase amplifier 203a and the inverting amplifier 203b, the processes respective of the LPFs 204a and 204b, the extraction of the positive noise component by the capacitor 403a and the inductor 404a, and the extraction of the negative noise component by the capacitor 403b and the inductor 404b are executed. The extracted positive noise component is output to the output path 210b of the negative PWM signal and is coupled with the negative noise component included in the negative PWM signal, and the extracted negative noise component is output to the output path 210a of the positive PWM signal and is coupled with the positive noise component included in the positive PWM signal. Therefore, the signal waveforms obtained respectively at the parts indicated by the arrows A to F shown in FIG. 8 of the digital amplifying apparatus are, as shown respectively in FIGS. 9(*a*) to (*f*), same as the signals and the noise waveforms of the first example shown respectively in FIGS. 5(*a*) to (*f*).

With the above noise component coupling, in the positive PWM signal combined with the negative noise component, of the positive noise components included in the positive PWM signals, the component having the same or approximately same output waveform and a phase that is inverse to that of the combined negative noise component is offset and removed by the negative noise component. However, a component having a different output waveform or a component having a phase that is not in phase is not offset by the negative noise component and, therefore, is not removed. Therefore, the positive noise component remains in the positive PWM signal. The negative noise component remains in the negative PWM signal for the same reason.

As shown in FIGS. 9(*g*) and (*h*), the positive and the negative noise components W2 and W4 remaining in the positive and the negative PWM signals W1 and W3 (see FIGS. 9(*c*) and (*d*)) have once been coupled respectively with the negative and the positive noise components W4 and W2 shown in FIGS. 9(*f*) and (*e*) and, therefore, have the same phases and the same waveforms or the approximately same waveforms. Therefore, the above remaining positive and the negative noise components W2 and W4 having the same phases and the same waveforms or the approximately same waveforms can be removed by the in-phase component removing circuit 800 shown in FIG. 8. The positive and the negative PWM signals W1 and W3 shown respectively in FIGS. 9(*i*) and (*j*), from which the in-phase positive and negative noise components W2 and W4 have respectively been further removed are output to the speaker 209 (see FIG. 8) and are output-amplified as shown in FIG. 9(*k*).

As described above, in the digital amplifying apparatus of the example, the positive and the negative noise components can be offset and removed by the noise component coupling similarly to the first example, and the positive and the negative noise components having the same phases and the same or approximately same waveforms, that can not be offset by the noise component coupling, can be removed by the in-phase component removing circuit 800. Therefore, the same effect as the effect described for the first example can be obtained and reduction of the noise components can further be facilitated.

Third Example

Figure 10:
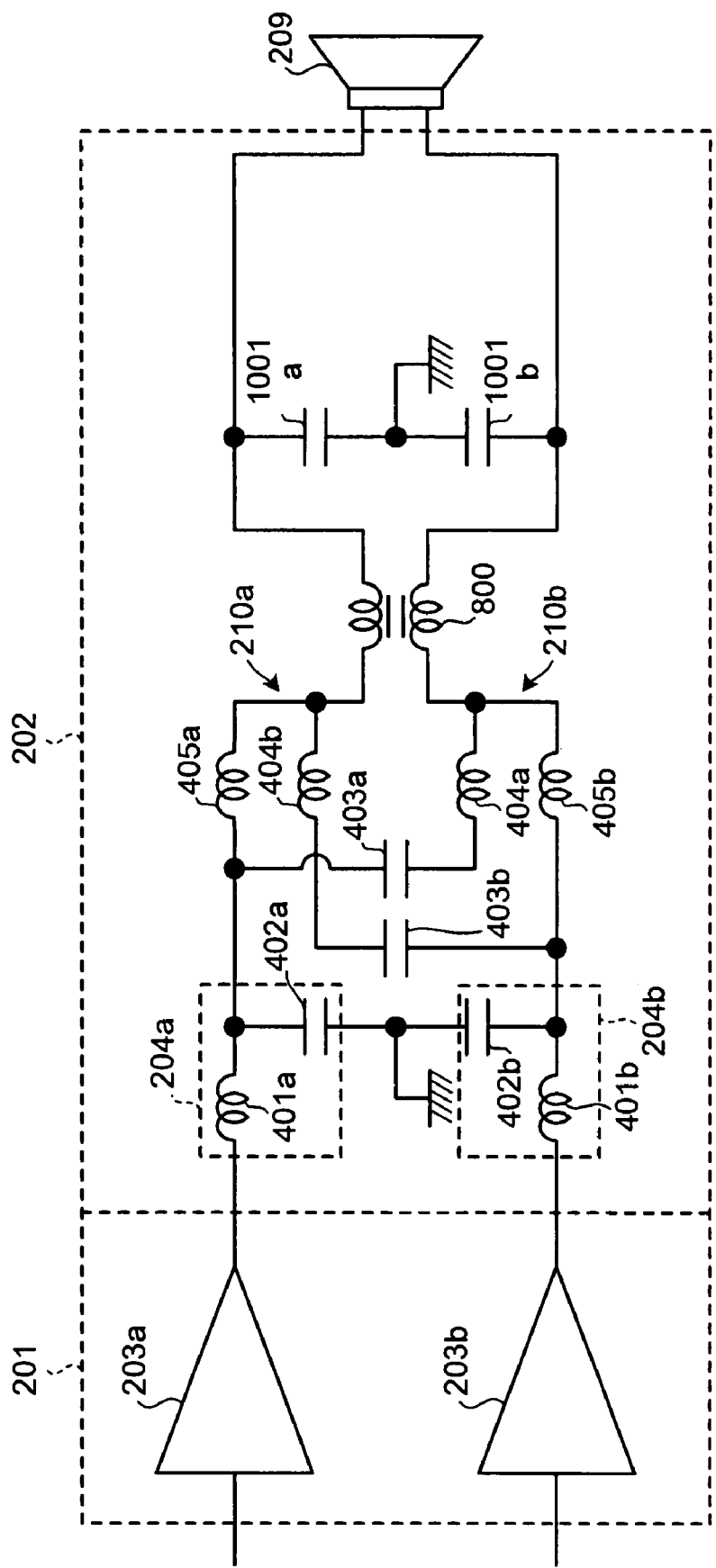
FIG. 10 is a schematic block diagram of a configuration of a digital amplifying apparatus according to a third example of an embodiment of the present invention.

FIG. 10 is a schematic block diagram of the configuration of a digital amplifying apparatus according to a third example of the present invention. As shown in FIG. 10, the same components as those shown in FIG. 8 are given the same reference numerals and description therefor is omitted.

As shown in FIG. 10, the digital amplifying apparatus of the example has a configuration that is the same as that of the digital amplifying apparatus according to the second example shown in FIG. 8, however, differs from the second example in that, respectively in the output paths 210*a* and 210*b* respectively of the positive and the negative PWM signals, capacitors 1001*a* and 1001*b* are disposed between the in-phase component removing circuit 800 and the speaker 209.

For the digital amplifying apparatus according to the example having the above configuration, the same effect as that described for the second example can be obtained. In particular, in the digital amplifying apparatus, the capacitors 1001*a* and 1001*b* disposed in the latter stage of the in-phase component removing circuit 800 can further respectively remove high-frequency noise components respectively included in the positive and the negative PWM signals that have passed through the in-phase component removing circuit 800. Therefore, further reduction of the noise components can be facilitated.

Figure 11:
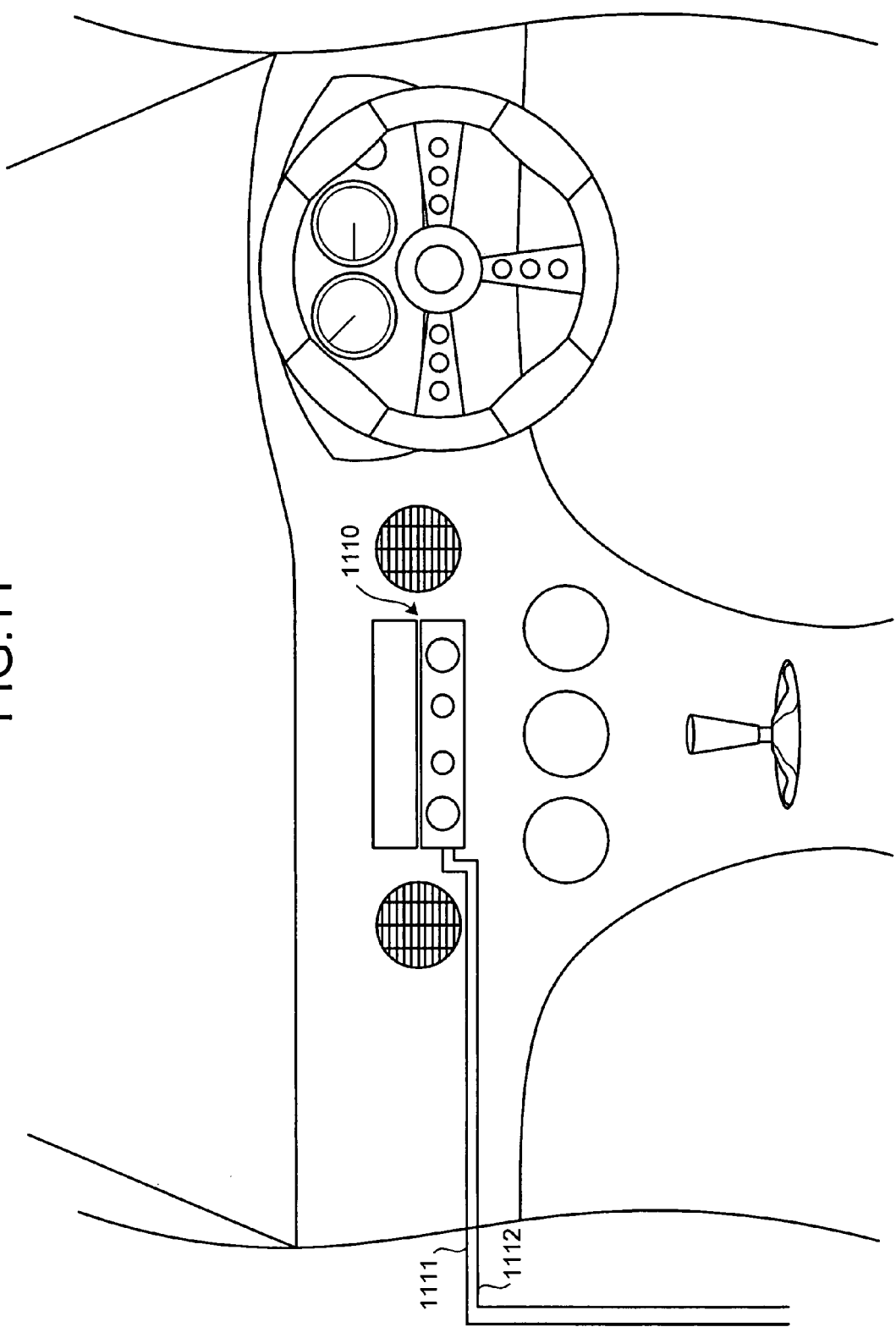
FIG. 11 is a graphical view of an application of the digital amplifying apparatus according to the present invention in a car audio apparatus 1110.

The configurations of the digital amplifying apparatus exemplified in the first to the third examples are examples of a configuration of the digital amplifying apparatus according to the present invention and do not limit the configuration thereto. The digital amplifying apparatus according to the present invention is useful as an amplifying apparatus applicable to various audio apparatuses, and more effectively when the digital amplifying apparatus is applied to the car audio apparatus 1110, etc., having a configuration that has a speaker line 1111 and an antenna 1112 disposed close to each other as shown in FIG. 11 and that, therefore, tends to be influenced by noises.

The invention claimed is:

1. A digital amplifying apparatus having amplifiers and low-pass filters, the amplifiers operating in a switching scheme and being respective to a positive signal and a negative signal in opposite phase of each other, the switching scheme causing switching noise respectively in the positive signal and the negative signal, the low-pass filters being respective to the positive signal and the negative signal, and the positive signal and the negative signal from the low-pass filters being transmitted to a speaker through a balanced transformerless connection, the digital amplifying apparatus comprising:

noise component extracting units that respectively extract a first residual component from the positive signal, the first residual component being the switching noise that is not removed by the low-pass filter respective to the positive signal, and a second residual component from the negative signal, the second residual component being the switching noise that is not removed by the low-pass filter respective to the negative signal;

noise component coupling units that respectively couple the first residual component extracted by the noise component extracting unit with the second residual component present in the negative signal, and the second residual component extracted by the noise component extracting unit with the first residual component present in the positive signal; and a same-phase component removing unit that receives the positive signal and the negative signal respectively output from the noise component coupling units, and respectively from the positive signal and the negative signal, removes the switching noise that is in phase.

2. The digital amplifying apparatus according to claim 1, wherein the noise component coupling unit couples the first residual component extracted by the noise component extracting unit with the negative signal from the low-pass filter respective to the negative signal and couples the second residual component extracted by the noise component extracting unit with the positive signal from the low-pass filter respective to the positive signal.

3. The digital amplifying apparatus according to claim 1, wherein the noise component extracting unit includes a first extracting unit that extracts the first residual component, and a second extracting unit that extracts the second residual component, a positive signal output path is formed by connecting the amplifier respective to the positive signal, the low-pass filter respective to the positive signal, and the first extracting unit, a negative signal output path is formed by connecting the amplifier respective to the negative signal, the low-pass filter respective to the negative signal, and the second extracting unit, and the noise component coupling unit includes a first noise coupling path that provides the first residual component extracted by the first extracting unit to the negative signal output path, and a second noise coupling path that provides the second residual component extracted by the second extracting unit to the positive signal output path.

4. The digital amplifying apparatus according to claim 1, wherein the noise component extracting units each include a capacitor and an inductor.

5. The digital amplifying apparatus according to claim 1, wherein the in-phase component removing unit includes a common-mode choke coil.

* * * * *